United States Patent [19]
Weling et al.

[11] Patent Number: 5,420,796
[45] Date of Patent: May 30, 1995

[54] METHOD OF INSPECTING PLANARITY OF WAFER SURFACE AFTER ETCHBACK STEP IN INTEGRATED CIRCUIT FABRICATION

[75] Inventors: Milind Weling, San Jose; Calvin T. Gabriel, Cupertino, both of Calif.

[73] Assignee: VLSI Technology, Inc., San Jose, Calif.

[21] Appl. No.: 173,581

[22] Filed: Dec. 23, 1993

[51] Int. Cl.⁶ ............................ G06F 15/46; H01J 3/14
[52] U.S. Cl. .................................. 364/468; 250/234; 250/306; 364/490; 437/8
[58] Field of Search .................... 364/468, 488–491, 364/552, 562, 559, 563; 250/491.1, 492.1–492.3, 234, 306, 307; 437/7, 8

[56] References Cited
U.S. PATENT DOCUMENTS
| | | | |
|---|---|---|---|
| 4,718,019 | 1/1988 | Fillion et al. | 364/490 X |
| 5,124,927 | 6/1992 | Hopewell et al. | 364/468 |
| 5,254,854 | 10/1993 | Betzig | 250/234 |

Primary Examiner—Joseph Ruggiero
Attorney, Agent, or Firm—Flehr, Hohbach, Test, Albritton & Herbert

[57] ABSTRACT

An integrated circuit (IC) fabrication process involves forming electronic devices on a semiconductor substrate. A metal layer is deposited thereover and then patterned to interconnect the semiconductor devices. A dielectric layer is deposited over the metal layer and substrate. The dielectric layer is etched back to prepare for the deposition of additional metal and dielectric layers. The etched surface is scanned by an atomic force microscope (AFM) to gather data representing the wafer surface roughness. The data is evaluated by a computer to generate at least one surface roughness signal. Depending on the value of the surface roughness signal, the IC fabrication process continues with the next step, a remedial action is taken, the IC fabrication process is adjusted for subsequent wafers, or the wafer is discarded.

19 Claims, 2 Drawing Sheets

METHOD OF INSPECTING PLANARITY OF WAFER SURFACE AFTER ETCHBACK STEP IN INTEGRATED CIRCUIT FABRICATION

FIELD OF THE INVENTION

The present invention relates to integrated circuit fabrication. It relates particularly to inspecting an integrated circuit in a fabrication process using an Atomic Force Microscope and conducting further action based on the inspection.

BACKGROUND OF THE INVENTION

An Integrated Circuit (IC) fabrication process involves forming electronic devices on a semiconductor substrate. A metal layer is deposited thereover and patterned to interconnect the semiconductor devices. The semiconductor devices and metal layer are then covered by dielectric materials such as silicon dioxide and spin-on-glass (SOG). The dielectric layer is etched back and then another layer of metal and dielectric materials are deposited thereover. This layering process continues to build the wafer until the IC is complete.

FIG. 1A depicts a cross section of a wafer 1 at an intermediate fabrication step. Wafer 1 is fabricated by forming electronic devices (not shown) on a semiconductor substrate 2, depositing a metal layer 3 thereover, and then patterning the metal layer 3 to interconnect the semiconductor devices. The height of the patterned metal layer results in an uneven topography. An oxide layer 4 is then deposited over the substrate and the metal layer. The oxide is typically a tetra-ethyl-orthosilicate (TEOS)-based oxide, deposited using chemical vapor deposition (CVD). The oxide layer forms hills in regions having metal thereunder and valleys in regions having no metal thereunder. This is simply a result of the underlying uneven topography. A thick SOG layer 5 is spun over the oxide layer and then etched back to planarize the uneven topography.

The SOG layer 5 must be etched back for two purposes: to provide a substantially planar surface for the deposition of additional materials; and to remove all the SOG from locations where vias through the oxide to the underlying metal will be placed, thus permitting a future metal deposition to fill the via and contact the underlying metal. Etching is a process known in the art and is typically performed using compounds such as $CHF_3$, $CF_4$, $C_2F_6$ and combinations thereof.

Other planarization techniques include resist etchback, deposition-etch-deposition, and chemical mechanical polishing.

Surface planarity is an important figure of merit in integrated circuit fabrication. Planarity critically determines depth of focus during lithography, susceptibility to electrical shorts between interconnects, minimum overetch time to prevent residues and filaments, interconnect reliability, and structural stress induced in subsequently deposited films.

Referring to FIG. 1A, the desired etchback level is D. When the SOG layer and the oxide layer hills are etched back to level D, optimum IC characteristics are achieved. These characteristics include strong via construction, good planarity and controlled impedance between metal layers. The SOG etch rate and the oxide etch rate must be well matched during etchback to achieve good planarity.

FIG. 1A illustrates a poorly fabricated wafer 1 having a rough surface that will induce stress in subsequently deposited materials. FIG. 1B illustrates a properly fabricated wafer 10 having a smooth surface that will not induce stress in subsequently deposited materials.

Present testing techniques mostly test an IC after it has been completely fabricated. Testing techniques generally follow one of two philosophies: nondestructive testing that involves verifying the logical function of the IC; and destructive testing that involves dissecting the IC or subjecting the IC to excessive conditions to induce failure. Logic testing is beneficial because it verifies proper circuit operation. Dissection and maximum tolerance testing are beneficial because they offer information about the internal construction, durability and projected lifespan of the IC.

Present destructive tests include dissecting an IC and viewing it with a scanning electron microscope (SEM), scanning tunneling microscope (STM) or similar apparatus. Moreover, there are destructive tests for determining maximum thermal stress and voltage breakdown of an IC. The thermal stress test is destructive because it measures maximum thermal stress until the IC fails. The voltage breakdown test is destructive because it measures input voltage until the IC dielectric breaks down and the IC short circuits.

In traditional IC manufacturing, when a fabrication run is made, several thousand or more ICs are produced. From that fabrication run, many ICs are sampled out from the production and identified for destructive testing. The destructive test examples given above are typical of the tests performed. The rationale is that a statistical sample will demonstrate characteristics analogous to each of the ICs produced in the fabrication run.

Useful information is gained from a sampled IC by the following example. When a dissection test is performed, using a SEM for example, if the dielectric layers appear too thin, it indicates that the dielectric layers in the IC do not provide proper electromagnetic isolation between the conductors. It also indicates that there may be high stress in the thin layer. If the dielectric layers appear too thick, it indicates that the dielectric layers in the IC are Thicker than necessary to isolate the conductors. A thick dielectric layer also indicates that not enough dielectric material was etched back during fabrication. This results in weak via construction through unstable SOG material.

Destructive testing can only provide information about the devices tested. Thus, devices in the same fabrication run are assumed to be analogous to the sampled IC. The present invention discloses a method for obtaining similar information in a nondestructive way.

A drawback to present testing techniques is that testing is mostly performed after the IC fabrication is complete. This may result in unnecessarily finishing an IC that began to exhibit poor characteristics early in the fabrication process.

What is needed is a method of inspecting ICs during fabrication processing. By inspecting the wafers during intermediate IC fabrication steps, useful information can be obtained about the evolving wafer. Further, if these techniques are nondestructive, every wafer can be tested and those meeting test criteria can be sent on for further fabrication while those not meeting test criteria can be either discarded or sent back for remedial action. In addition, the manufacturing process for subsequent wafers can be adjusted to avoid the problems identified by the testing of earlier manufactured wafers. An inline nondestructive test directly promotes higher IC yield and longer IC life.

The present invention provides such a method.

SUMMARY OF THE INVENTION

The present invention provides a method of inspecting integrated circuit (IC) wafers between fabrication steps. An Integrated Circuit (IC) fabrication process involves forming electronic devices on a semiconductor a substrate. A metal layer is deposited thereover and then patterned to interconnect the semiconductor devices, producing a wafer surface having hills and valleys. The semiconductors and metal layer are then covered by dielectric materials such as silicon oxide and spin-on-glass (SOG). The wafer surface at this point is typically undulated. The dielectric layer is etched back and then another layer of metal and dielectric materials are deposited thereover. This layering process continues on the wafer until fabrication of the IC is complete. A typical wafer has room enough for many IC devices.

The present invention provides a method of inspecting the surface of the wafer after etchback steps as an integral step of an IC fabrication process. An intermediate step wafer surface inspection is made in order to determine the quality of the evolving wafer and the quality of the fabrication process. This inspection is performed by employing an atomic force microscope (AFM) to scan a predetermined region of the wafer. A predetermined region is selected that is representative of the wafer surface after a particular fabrication step. However, a selection may also be made of a region that is not representative of the entire surface, such as the most densely populated region for example. In an alternate embodiment, a test region is created for inspection.

An AFM is a device utilizing a stylus mounted on a cantilever. A sample is placed under the stylus and the sample is moved in two dimensions (X and Y). A sensing device determines the position of the stylus (third dimension, Z) with respect to the two dimensional position of the sample. Thus, by moving the sample under the AFM stylus, three dimensional data can be recorded. This results in the ability to record and calculate statistically important parameters with respect to each sample.

A computer controls the AFM, gathers data from the AFM and processes the data according to a predetermined procedure. Examples of such procedures include procedures for determining maximum height, maximum depth, average height, standard deviation of the surface roughness, and overall roughness. Information gained from these procedures is relevant to the wafer fabrication process. Surface planarity is an important figure of merit in integrated circuit fabrication. Further, collected data serves to quantify the inspection procedures and directly serves to improve the quality of the fabrication process. After the procedures are performed, the computer generates a signal to indicate whether the wafer should continue to be processed, returned to a prior step for remedial action or discarded.

Therefore, it is a primary object of the present invention to provide a method employing intermediate step inspection in integrated circuit fabrication.

It is a secondary object of the present invention to provide a method of determining the roughness of an IC wafer surface according to a predetermined procedure and thereby determining whether to continue processing the wafer, return the wafer to a prior step for remedial action or discard the wafer.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

An Integrated Circuit (IC) fabrication process involves forming electronic devices on a semiconductor substrate. A metal layer is deposited thereover and then patterned to interconnect the semiconductor devices. The semiconductors and metal layer are then covered by dielectric materials such as silicon oxide and spin-on-glass (SOG). The dielectric layer is etched back to prepare for the deposition of additional devices, metals and dielectrics.

Figure 1A:
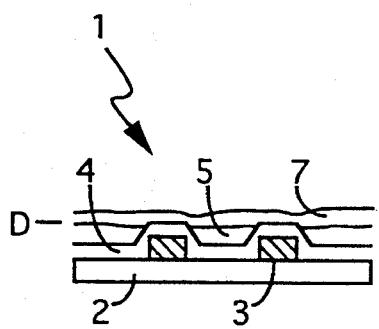
FIG. 1A depicts a wafer in a fabrication step having a substrate, metal layer, oxide layer, SOG layer and cap oxide.
Figure 1B:
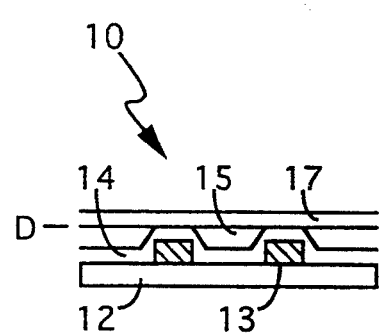
FIG. 1B depicts a wafer in a fabrication step having a substrate, metal layer, oxide layer, SOG layer and cap oxide.

Results of intermediate wafer fabrication steps are depicted in FIGS. 1A and 1B. FIG. 1A shows a wafer 1 comprising a substrate 2, metal layer 3, oxide layer 4, SOG layer 5 and cap oxide layer 7. Wafer 1 has poor planarity. This poor planarity could be a result of too thick metal deposition on the wafer, too little dielectric deposited over the metal, improper SOG etchback process conditions, or any of several other causes. A wafer with poor planarity is not suitable for the deposition of additional layers of metal and dielectric materials and for photoresist patterning.

FIG. 1B shows a wafer 10 comprising a substrate 12, metal layer 13, oxide layer 14, SOG layer 15 and cap oxide layer 17. Wafer 10 has good planarity. Wafer 10 is ideally suited for the deposition of additional metal and dielectric materials.

Figure 2:
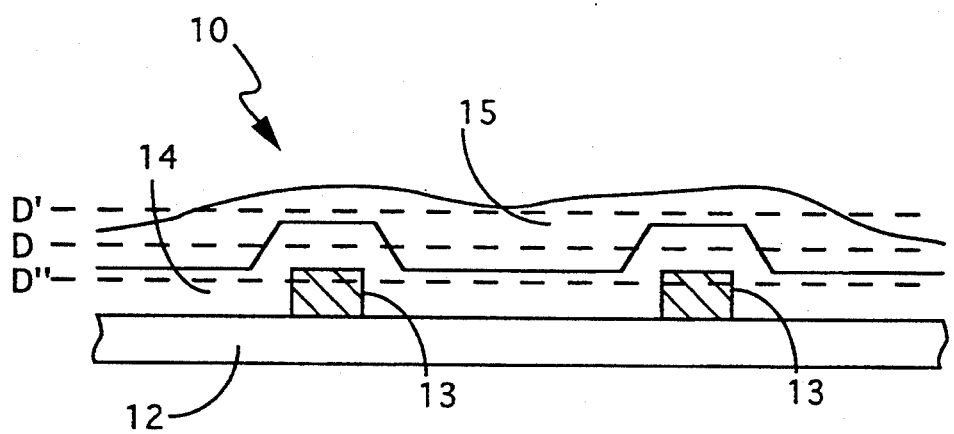
FIG. 2 depicts an IC in a fabrication step having a substrate, metal layer, nitride or oxide layer and SOG layer.

FIG. 2 depicts a cross section of an integrated circuit (IC) 10 at an intermediate fabrication step. IC 10 comprises a substrate 12, patterned interconnect layer 13, nitride or oxide layer 14 and SOG layer 15. The patterned interconnect layer is generally metal, polysilicon or other low resistivity material. For purposes of describing the present invention, it is assumed that layer 13 is a patterned metal interconnect layer.

To construct IC 10 a number of semiconductor devices (not shown) are first placed on substrate 12. A patterned metal layer 13, is then deposited on substrate 12 to connect the semiconductor devices. Metal layer 13 is a metal layer having a thickness of about 5000 Å to 7,000 Å.

Layer 14 preferably consists of Silicon Dioxide ($SiO_2$) or Silicon Nitride (SIN) and is deposited over substrate 12 and metal layer 13. Preferably, layer 14 is deposited in a commercially available PECVD reactor at a temperature of about 400 C and a pressure of about 2 Torr. The layer 14 comprises hills over regions having metal thereunder and valleys having no metal thereunder. This is depicted in FIG. 2 where it can be seen that the layer 14 over the metal layer 13 approaches level D' while the layer 14 over the non-metal regions is closer to D". A deposited thickness of about 5000 Å to 6,000 Å is desirable to adequately cover the surface and to allow for the etching back of about 1,000 Å to 3,000 Å of the nitride layer hills. More generally the deposited layer 14 should be at least 4,000 Å thick and preferably at least 5,000 Å) thick.

SOG layer 15 is spun over layer 14. The spinning causes the SOG to undulate over the layer 14 hills and valleys. The result is a thick SOG layer that fills the valleys and covers the hills on the layer 14. The SOG is spun out to create a thickness of approximately 2,500 Å to 3,500 Å over the layer 14 hills.

Etchback of the SOG layer and the layer 14 hills is performed using plasma etching. Plasma etchback is a well known technique for removing a specified depth of a sacrificial layer in order to planarize the surface. In the preferred embodiment, the etch rates of the SOG layer and the layer 14 can be set to be substantially equal by adjusting the etch process conditions.

In the preferred embodiment, the D line of FIG. 2 is approximately 3,000 Å above metal traces 13. An etch time is chosen to etchback SOG layer 15 and layer 14 to the D line of FIG. 2. For example, if the deposited layer 14 is 6,000 Å, thick and the SOG thickness over the nitride hills is 4,000 Å, an etchback depth of 7,000 Å is desired. This results in the desired 3,000 Å of layer 14 material over the metal traces, and SOG filling the valleys of the layer 14 as depicted in FIG. 2.

Figure 3:
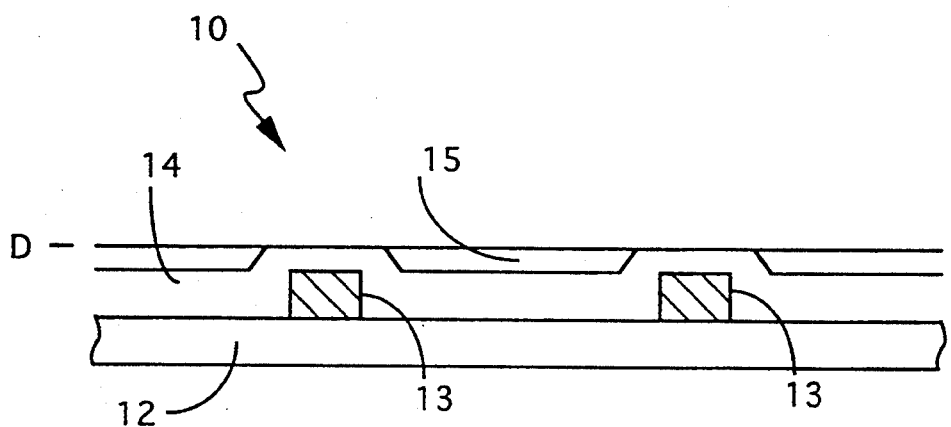
FIG. 3 depicts the IC of FIG. 3 after an etchback step.

FIG. 3 shows IC 10 after etchback. Since SOG layer 15 and layer 14 are etched at the same rate, the resulting surface is planar.

SURFACE INSPECTION USING AFM

Figure 4:
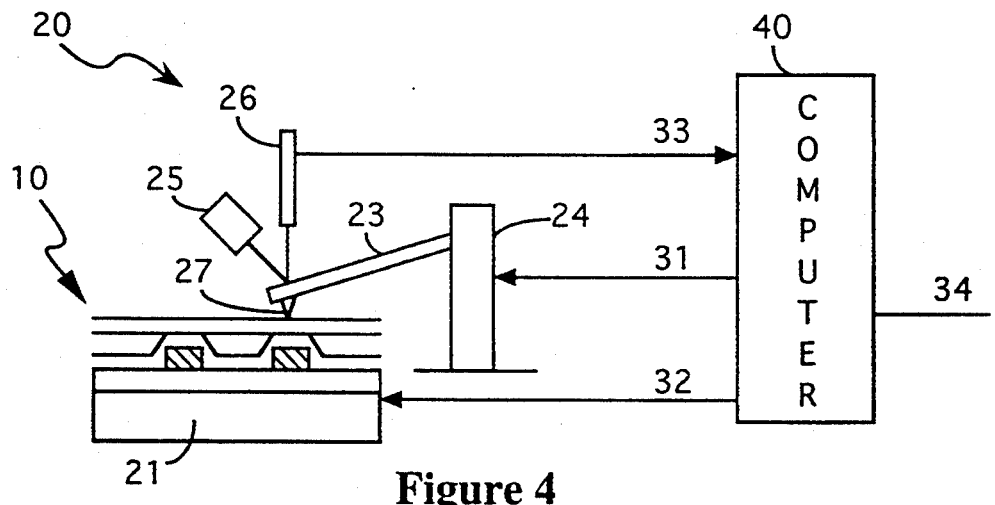
FIG. 4 depicts an atomic force microscope (AFM) inspecting a wafer surface.

After each etchback step in the wafer fabrication process, (e.g., wafers 1 and 10), the resulting wafer surface is inspected to determine its characteristics. Referring to FIG. 4, the etched surface is scanned by an atomic force microscope (AFM) to gather data representing the wafer surface. FIG. 4 illustrates an Atomic Force Microscope (AFM) 20 having a base 21, cantilever 23, cantilever support 24, stylus 27, emitter 25 and cantilever position sensor 26. Emitter 25 typically emits light that is reflected from the cantilever and received by the sensor to determine the stylus position. A sample wafer 10 is affixed to base 21 and placed under stylus 27 for inspection. FIG. 4 also shows a computer 40 used to control the AFM 20 and to collect measurement data.

The base is a platform holding the sample and moveable in two directions; for example, moveable in the X-Y plane, This is accomplished by using a piezoelectric scanner, A piezoelectric scanner is a device employing electrically sensitive material to induce movement of the sample in the X-Y plane based on an electrical input. An example of an electrically sensitive material is quartz. The electrical input is delivered from computer 40 to base 21 via communication line 32. In practice, the electrical input is generated to move the sample in a raster pattern, thereby ensuring that every area of a predetermined region passes under the stylus. In this description a predetermined region is selected for inspection. The selected region can include several areas of the wafer.

The cantilever is moveable in one direction; for example, moveable in the Z direction. The cantilever forms a spring that holds the stylus in position against the sample. Measurement of the stylus position is accomplished by adding a fine measurement of the cantilever position to a rough position value. The rough cantilever position is determined by the cantilever support's current vertical setting. The cantilever support 24 is adjusted by the computer 40 via communication line 31 until the stylus 27 is proximate the surface of sample 10. There is a fine measurement performed by emitter 25 and sensor 26; the sensor detects the position of the cantilever reflected light ray as the sample is moved under the stylus. The data from sensor 26 is transmitted to the computer via communication line 33. The resolution of the Z position data is typically one Angstrom (1 Å) or better using currently available atomic force microscopes and cantilevers.

Computer 40 receives Z position data from the AFM over communication line 33. This data is collected and stored in the memory along with data representing the X and Y positions corresponding to Z position data values.

Figure 5:
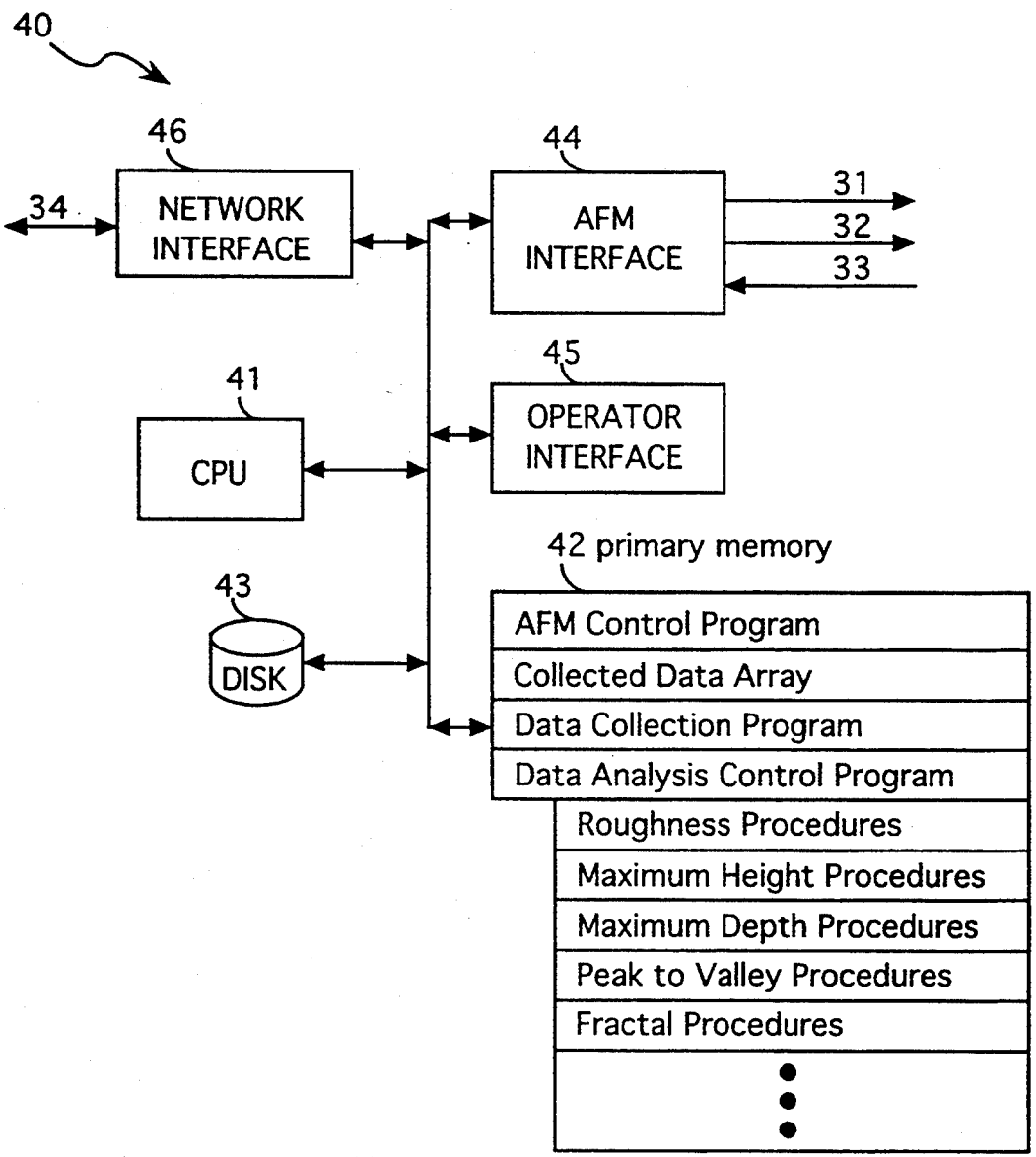
FIG. 5 depicts the computer of FIG. 4, including a list of sample predefined procedures.

Referring to FIGS. 4 and 5, a data analysis procedure is performed on the collected data by computer 40. Computer 40 has a central processing unit (CPU) 41, primary memory 42, disk memory 43, AFM interface 44, operator interface 45 and network interface 46.

Primary memory 42 also shows contents having an AFM control program, collected data array, data collection program, and data analysis control program. The data analysis control program has several procedures therein. These procedures include roughness procedures, maximum height procedures, maximum depth procedures and peak to valley procedures. Alternate procedures include overall roughness procedures, lake filling procedures and fractal procedures.

Information gained from these procedures is important to the wafer fabrication process. Surface planarity, for example, is an important figure of merit in integrated circuit fabrication. Planarity critically determines depth of focus during lithography, susceptibility to electrical shorts between interconnects, minimum overetch time to prevent residues and filaments, interconnect reliability, and structural stress induced in subsequently deposited films. Predetermined procedures can also inform the user about the thickness and quality of deposited layers. This information serves to quantify the inspection and directly serves to improve the quality of the fabrication process.

For the purposes of testing wafer planarity after an etchback step, surface roughness variations less than 200 Å are indicative of the characteristics of the top layer material (e.g., SOG) itself, and are not indicative of variations that will negatively impact on the next material layers to be deposited on the wafer. Typically, surface height variations of the etched back surface of more than 400 Å are indicative of a poor quality surface, and surface height variations of more than 800 Å are indicative of a wafer that needs to be discarded.

The maximum height procedure defines $Z_{max}$ as the maximum height, and comprises determining the maximum height of the wafer from the gathered data. This data point represents the maximum upward stylus displacement. This procedure compares a data point ($X_a$, $Y_a$, and $Z_a$) against every other data point ($X_n$, $Y_n$, $Z_n$) to determine which data point has the greatest Z value, The maximum depth procedure defines $Z_{min}$ as the minimum height, and comprises determining the minimum height of the wafer from the gathered data. This data point represents the minimum upward stylus displacement. This procedure compares a data point ($X_a$, $Y_a$, and $Z_a$) against every other data point ($X_n$, $Y_n$, $Z_n$) to determine which data point has the least Z value.

An arithmetic mean procedure defines Z as the arithmetic mean height. This procedure, represented by equation 1, sets Z equal to the sum of all height values Z divided by the number of data points N in the dataset ($X_n$, $Y_n$, $Z_n$).

$$\overline{Z} = \frac{1}{N} \sum_{i=1}^{N} Z_i \tag{1}$$

An arithmetic mean of the deviations in height procedure defines $R_a$ as the arithmetic mean of the deviations in height. This procedure, represented by equation 2, sets $R_a$ equal to the sum of the absolute value of Z minus $\overline{Z}$ for all data points divided by the number of data points.

$$R_a = \frac{1}{N} \sum_{i=1}^{N} |Z - \overline{Z}| \tag{2}$$

A root-mean-square of the deviations in height procedure defines $R_{rms}$ as the root-mean-square of the deviations in height. This procedure, represented by equation 3, sets $R_{rms}$ equal to the square root of the sum of $Z^2$ for all data points divided by the number of data points.

$$R_{rms} = \sqrt{\frac{1}{N} \sum_{i=1}^{N} Z_i^2} \tag{3}$$

A maximum height above Z procedure defines $R_p$ as the maximum height above Z. This procedure, represented by equation 4, sets $R_p$ equal to the maximum Z minus $\overline{Z}$.

$$R_p = Z_{max} - \overline{Z} \tag{4}$$

A peak to valley height procedure defines $R_t$ as the maximum peak to minimum valley height. This procedure, represented by equation 5, sets $R_t$ equal to the maximum Z minus the minimum Z.

$$R_t = Z_{max} - Z_{min} \tag{5}$$

A mean of $R_p$ procedure defines $\overline{R}_p$ as the arithmetic mean of the height above Z. This procedure, represented by equation 6, sets $\overline{R}_p$ equal to the sum of a set of $R_p$ values divided by the number in the set. In this example, M can represent either a number of areas for a single wafer or can represent a number of areas for a plurality of wafers where similar regions of the plurality of wafers are inspected.

$$\overline{R}_p = \frac{1}{M} \sum_{i=1}^{M} (R_p)_i \tag{6}$$

A mean of $R_t$ procedure defines $\overline{R}_t$ as the arithmetic mean of the peak to valley heights. This procedure, represented by equation 7, sets $\overline{R}_t$ equal to the sum of a set of $R_t$ values divided by the number in the set. In this example, M can represent either a number of areas for a single wafer or can represent a number of areas for a plurality of wafers where similar regions of the plurality of wafers are inspected.

$$\overline{R}_t = \frac{1}{M} \sum_{i=1}^{M} (R_t)_i \tag{7}$$

A bearing ratio procedure defines $T_b$ as the bearing ratio. This procedure, represented by equation 8, sets $T_b$ equal to the length of surface existing between the highest peak ($R_p$) and a chosen depth (b) expressed as a percentage of the profile length (L).

$$T_b = \frac{100}{L} \sum_{i=1}^{N(b)} Z * b_i \tag{8}$$

A surface area roughness procedure defines $R_{sa}$ over the whole dataset taking the resolution H of the data into account. This procedure, represented by equation 9, sets $R_{sa}$ equal to the sum of the whole dataset of the absolute value of the Z average minus the Z value for the data point over the resolution H squared.

$$R_{sa} = \frac{\Sigma^{dataset} |Z_{value} - \overline{Z}|}{H^2} \tag{9}$$

A surface root-mean-square procedure defines $R_{srms}$ over the whole dataset taking the resolution H of the data into account. This procedure, represented by equation 10, sets $R_{srms}$ equal to the square root of the sum of the whole dataset of the Z average minus the Z value squared over the resolution H squared.

$$R_{srms} = \sqrt{\frac{\Sigma^{dataset} (Z_{value} - \overline{Z})^2}{H^2}} \tag{10}$$

Alternate procedures can include overall roughness procedures, lake filling procedures or fractal procedures. An overall roughness procedure is one that measures the aggregate roughness of the surface. A lake filling procedure is one that uses a predetermined level below which lakes are developed in the surface representation. A fractal procedure is one that quantifies the surface based on a dimensional representation. A fractal procedure, for example, assigns a value between 2 and 3 to a three dimensional surface where 2 is perfectly horizontal and 3 is perfectly vertical.

Once the predetermined procedure has been performed on the data, a signal is generated by computer 40. This signal is based on a number of factors stored in computer memory 42 (data analysis program). For example, if a $R_{sa}$ procedure is being performed, an upper threshold may establish a first action taken when a procedure signal crosses the upper threshold. A lower threshold may establish a second action taken when a procedure signal crosses the lower threshold. If neither threshold is crossed, a third action is taken. These actions may be: first, continue with the fabrication process; second, discard the wafer; and third, send the wafer back to a prior step for remedial fabrication (e.g., remove the last layer deposited, re-deposit that layer and repeat the etchback step). A fourth action may also be taken independently of these first three actions and may be based on a same or different threshold.

A preferred fourth action is one taken to improve the quality of the wafers by using the gathered data to evaluate and fine tune the fabrication process. Since the gathered data represents the quality of the fabricated wafer, the apparatus feeds back this quality measurement to modify the fabrication process for higher quality. Modifications to the fabrication process to increase quality include adjusting wafer etch time and modifying the etch process to adjust the SOG 15 and layer 14 etch rates to be substantially equal. For example, if the surface roughness variations are 200 Å or less the wafer continues to be processed and no modification to the fabrication process is made, if the surface roughness variations are between 200 Å and 400 Å the wafer continues to be processed and the fabrication process is modified to increase quality, if the surface roughness variations are between 400 Å and 800 Å the wafer is sent back for remedial action and the fabrication process is modified, and if the surface roughness variations are 800 Å or greater the wafer is discarded and the process is modified.

Alternately, the data analysis program may execute two or more of the data analysis procedures mentioned above to produce several result signals, and then combine those result signals to produce a combined signal or figure of merit that is then compared with various threshold values to determine what course of action should be taken.

Referring to FIG. 1A, wafer 1 must either be remedially attended to or discarded. A remedial step can be one of depositing additional dielectric materials over the wafer and then re-etching these materials in an attempt to properly planarize the surface. This would be performed if the etch process conditions have been improperly controlled, for example. On the other hand, referring to FIG. 1B, wafer 10 is ideally suited for the deposition of additional layers. Therefore, an inspection procedure executed on gathered AFM data will send wafer 10 along for further fabrication.

In the preferred embodiment, this procedure signal is sent by network interface 46 via communication line 34 to the fabrication process. The fabrication process then carries out the required action based on the procedure signal. In the above example, if the procedure signal is above a first threshold, the fabrication process would continue; if the procedure signal is below a second threshold, the fabrication process would discard the wafer; and if the procedure signal is between the first threshold and the second threshold, the fabrication process would send the wafer back for remedial action.

Another feature of the preferred embodiment includes sending the procedure signal to an operator. This is done by operator interface 45. For example, the operator interface may have a monitor and keyboard. The operator can then observe and control the wafer fabrication process. If, for example, the computer sends a signal to the monitor indicating that the inspected wafer is marginal, the operator can instruct the fabrication process to continue fabrication, discard the wafer or send the wafer back for remedial processing.

The operator may also alter the inspect procedure or the fabrication procedure. The operator may obtain statistics about the fabrication process and the number of successful wafers that have been inspected. The operator may also alter the inspection procedure and alter the selection of the wafer inspection criteria. Through the operator interface, an operator can both obtain data and instruct the computer to execute a number of stored procedures.

In this way, control of planarity after any given step can be characterized by scanning the same area for different wafers from the same or different lots after that step. Further, the evolution of planarity for a given wafer can be characterized by measuring planarity of the same area after each step in the fabrication process that affects planarity.

The result is an improved fabrication process that gains higher yield and improved device reliability.

Alternate embodiments of the present invention include creating a test region for inspection. A test region is a region of the wafer that is layered just like the other regions. However, the test region may be indicative of a dense area or a sparse area. This will create data for the predetermined procedures to evaluate.

Another alternate embodiment is one where the test region is a reference surface and a surface of the IC wafer is also inspected, using the test region surface as a reference. For example, this is performed by using a nominally flat surface of "over field oxide" as the test region. This nominally flat surface then serves as a height and roughness reference.

Another alternate embodiment comprises more than the two thresholds discussed in the preferred embodiment, Thus, based on the procedure signal, there may be many courses of action available, In a remedial action for example, the remedial step may be minor if the signal is close to a threshold and the remedial step may be major if the signal is far from the threshold. Moreover, the continuation path of the wafer may be based on the procedure signal. For example, a first wafer may pass a military grade threshold and continue to be fabricated for the military grade while a second wafer failing to pass the military grade threshold may be passed to continue in a commercial grade fabrication process.

Modifications and variations may be made to the disclosed embodiments without departing from the subject and spirit of the invention as defined by the following claims.

What is claimed is:

1. A method of controlling an integrated circuit fabrication process, comprising the steps of:
   (a) performing a first step of integrated circuit fabrication on a wafer comprising the step of:
   forming a first set of one or more material layers on said wafer; and
   (b) performing a second sequence of integrated circuit fabrication steps on said wafer comprising the steps of:
   scanning a predetermined area of said wafer's surface with an atomic force microscope;
   gathering surface height data from the atomic force microscope representing height with respect to position;
   generating from the gathered surface height data at least one signal indicative of surface planarity;
   comparing the at least one signal with predefined planarity criteria to determine if said forming step produced a surface that meets said predefined planarity criteria, 2. The method of claim 1, wherein:
said generating step generates said at least one signal using an arithmetic mean procedure.

3. The method of claim 1, wherein:

said generating step generates said at least one signal using a root mean-square procedure.

4. The method of claim 1, wherein:
said generating step generates said at least one signal using a maximum height procedure.

5. The method of claim 1, wherein:
said generating step generates said at least one signal using a peak to valley height procedure.

6. The method of claim 1, wherein:
said generating step generates said at least one signal using a roughness procedure.

7. The method of claim 1, further including:
when the at least one signal is above a predetermined threshold, discarding the wafer;
when the at least one signal is equal to a predetermined threshold, returning the wafer to a prior step of the integrated circuit fabrication for repair; and
when the at least one signal is below a predetermined threshold, continuing with the integrated circuit fabrication process.

8. The method of claim 1, further including:
when the at least one signal is above a predetermined threshold, modifying the fabrication process to increase the quality of subsequent wafer production.

9. The method of claim 1, wherein:
after said second sequence of steps is performed, said first and second sequences of steps are again performed.

10. A method of controlling an integrated circuit fabrication process, comprising the steps of:
(a) performing a first sequence of integrated circuit fabrication steps on a wafer comprising the steps of:
forming and patterning a first set of one or more material layers on said wafer, wherein the first set of layers is deposited and patterned in such manner to create hills and valleys therein;
forming a second set of one or more material layers over said first set of material layers;
etching back the deposited second set of material layers to produce a surface on the resulting wafer;
(b) performing a second sequence of integrated circuit fabrication steps on said wafer comprising the steps of:
scanning a predetermined area of said wafer's surface with an atomic force microscope;
gathering surface height data from the atomic force microscope representing height with respect to position;
generating from the gathered surface height data at least one signal indicative of surface planarity;
comparing the at least one signal with predefined planarity criteria to determine if said etching back step produced a surface that meets said predefined planarity criteria.

11. The method of claim 10, wherein:
said generating step generates said at least one signal using an arithmetic mean procedure.

12. The method of claim 10, wherein:
said generating step generates said at least one signal using a roughness procedure.

13. The method of claim 10, further including:
when the at least one signal is above a predetermined threshold, discarding the wafer; when the at least one signal is equal to a predetermined threshold, returning the wafer to a prior step of the integrated circuit fabrication for repair; and
when the at least one signal is below a predetermined threshold, continuing with the integrated circuit fabrication process.

14. The method of claim 10, further including:
when the at least one signal is above a predetermined threshold, modifying the fabrication process of subsequent wafer production.

15. The method of claim 10, wherein:
after said second sequence of steps is performed, said first and second sequences of steps are again performed.

16. A method of controlling an integrated circuit fabrication process, comprising the steps of:
forming and patterning a first material layer on said wafer, wherein the first material layer is deposited and patterned in such manner to create hills and valleys therein;
forming a second material layer over said first material layer;
etching back the deposited second material layer to produce a surface on the resulting wafer;
scanning a predetermined region of the wafer surface with an atomic force microscope;
gathering data from the atomic force microscope representing height with respect to position;
generating from the gathered data at least one signal indicative of surface roughness using a predetermined procedure;
comparing the at least one signal indicative of surface roughness with predefined criteria;
when the at least one signal is below a first predetermined threshold of the predetermined criteria, continuing with the integrated circuit fabrication process;
when the at least one signal is within an intermediate range of said first predetermined threshold and a second predetermined threshold of the predetermined criteria, performing a remedial process on the wafer; and
when the at least one signal is above said second predetermined threshold of the predetermined criteria, discarding the wafer.

17. The method of claim 16, wherein:
said predetermined procedure is an arithmetic mean of the deviations in height from the profile mean procedure.

18. The method of claim 16, wherein:
said predetermined procedure is a root-mean-square procedure.

19. The method of claim 16, further including the step of:
when the at least one signal is above a predetermined threshold, modifying the fabrication process to increase the quality of subsequent wafer production.

* * * * *